United States Patent [19]
Yamanaka

[11] Patent Number: 5,384,728
[45] Date of Patent: Jan. 24, 1995

[54] OPTICAL INFORMATION STORAGE APPARATUS USING OPTICAL FIBER

[75] Inventor: Yutaka Yamanaka, Tokyo, Japan

[73] Assignee: NEC Corporation, Tokyo, Japan

[21] Appl. No.: 67,996

[22] Filed: May 27, 1993

[30] Foreign Application Priority Data

May 29, 1992 [JP] Japan .................. 4-138134

[51] Int. Cl.[6] .................. G11C 19/30; G11C 13/04
[52] U.S. Cl. .................. 365/114; 365/215; 365/234
[58] Field of Search .................. 365/114, 122, 64, 215, 365/234

[56] References Cited

U.S. PATENT DOCUMENTS 5,058,060 10/1991 Su .................. 365/215 X
5,228,001 7/1993 Birge et al. .................. 365/215
5,272,667 12/1993 Yamada et al. .................. 365/114 X

OTHER PUBLICATIONS

M. I. Belovolov et al., "Fiber optic dynamic memory for fast signal processing and optical computing" SPIE vol. 963 Optical Computing 88(1988), pp. 90–97.

*Primary Examiner*—Eugene R. LaRoche
*Assistant Examiner*—Do Hyun Yoo
*Attorney, Agent, or Firm*—Ostrolenk, Faber, Gerb & Soffen

[57] ABSTRACT

An optical information storage apparatus includes an optical switch element and an optical fiber. The optical switch element receives an optical input and outputs an optical output only when the optical input is equal to or greater than a predetermined value. The optical fiber constitutes a first optical path. The optical fiber has at least one end face and receives an optical output emitted from the optical switch element through the at least one end face, guides the optical output, and emits an output beam, constituting the optical input, onto the optical switch element.

12 Claims, 6 Drawing Sheets

FIG. 1

FIG.2A DATA STRING IN OPTICAL FIBER 3

FIG.2B OUTPUT FROM DRIVER CIRCUIT 12

FIG.2C EXTERNAL OPTICAL INPUT

OPTICAL INFORMATION STORAGE APPARATUS USING OPTICAL FIBER

BACKGROUND OF THE INVENTION

The present invention relates to an optical information storage apparatus using an optical fiber and, more particularly, to an optical information storage apparatus using an optical fiber in an optical information processing apparatus for storing and processing information by using light.

Information processing based on light is expected to overcome the limits of speed and capacity of information processing performed by using only conventional electronic circuits. An information processing apparatus for such processing always requires a storage apparatus.

As a scheme for storing optical information, there is proposed a scheme for storing optical information upon converting light into electrical signals. Prototype optical memory apparatuses manufactured by using various optical device techniques basically use such electrical signals. In contrast to this, as an apparatus using a scheme for storing optical information as light, there is provided an optical information storage apparatus utilizing the transmission delay time of an optical fiber.

Figure 13:
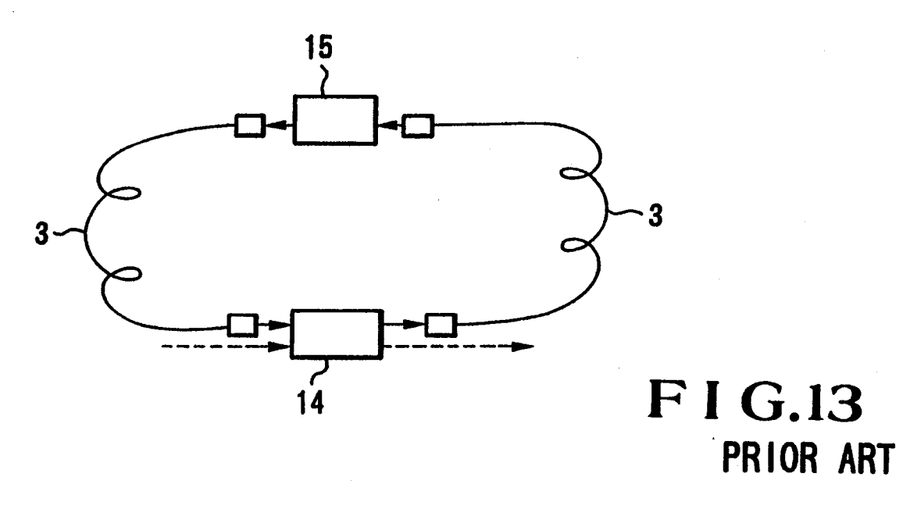
FIG. 13 is a block diagram showing a conventional optical information storage apparatus using an optical fiber.

FIG. 13 shows the basic arrangement of a conventional optical information storage apparatus using an optical fiber.

Figures 14A, 14B:
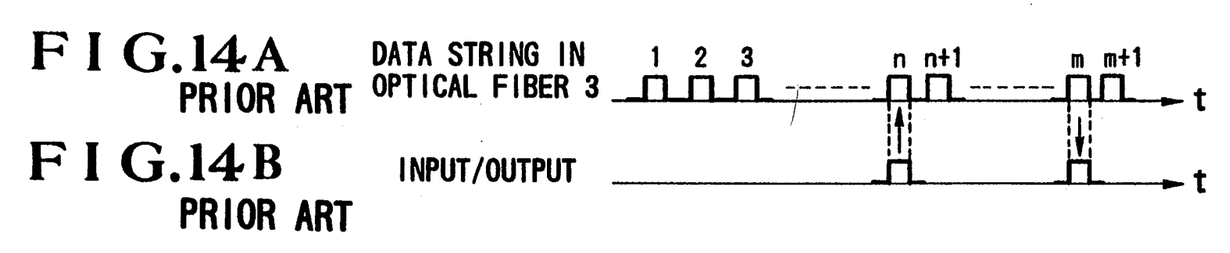
FIGS. 14A and 14B are timing charts of signals at portions of the conventional apparatus, showing an operation of the apparatus.

Referring to FIG. 13, a loop of an optical transmission path is formed by an optical fiber 3. Optical information is stored, as a time series signal, in the loop, as shown in FIG. 14A. In this case, the length of the time series is determined by the time required for transmission through the total length of the looped optical fiber 3. Information is recorded or reproduced by adding new data to the data in the loop or extracting specific data therefrom through a directional coupler type optical switch 14 using a lithium niobate substrate, as shown in FIG. 14B.

Such a conventional optical information storage apparatus using the optical fiber 3 requires an optical amplification function for compensating for a loss due to transmission. Such a function can be realized by inserting an optical amplifier 15 in the loop, as shown in FIG. 13. Such an optical amplifier, however, generates noise to decrease the S/N ratio of stored information with time. In addition, since there are many elements in the loop, the size of the apparatus becomes large.

SUMMARY OF THE INVENTION

It is an object of the present invention to provide an optical information storage apparatus which can store optical information as light.

It is another object of the present invention to provide an optical information storage apparatus which requires no optical amplifiers.

It is still another object of the present invention to provide an optical information storage apparatus which has a simple arrangement.

In order to achieve the above objects, according to the present invention, there is provided an optical information storage apparatus comprising an optical switch element which shifts from a non-emission state to an emission state upon reception of an optical input, and an optical fiber, constituting a first optical path, for receiving an optical output emitted from the optical switch element through at least one of end faces, guiding the optical output, and causing an output beam to be incident, as the optical input, onto the optical switch element.

DESCRIPTION OF THE PREFERRED EMBODIMENTS

The present invention will be described below with reference to the accompanying drawings.

Figure 1:
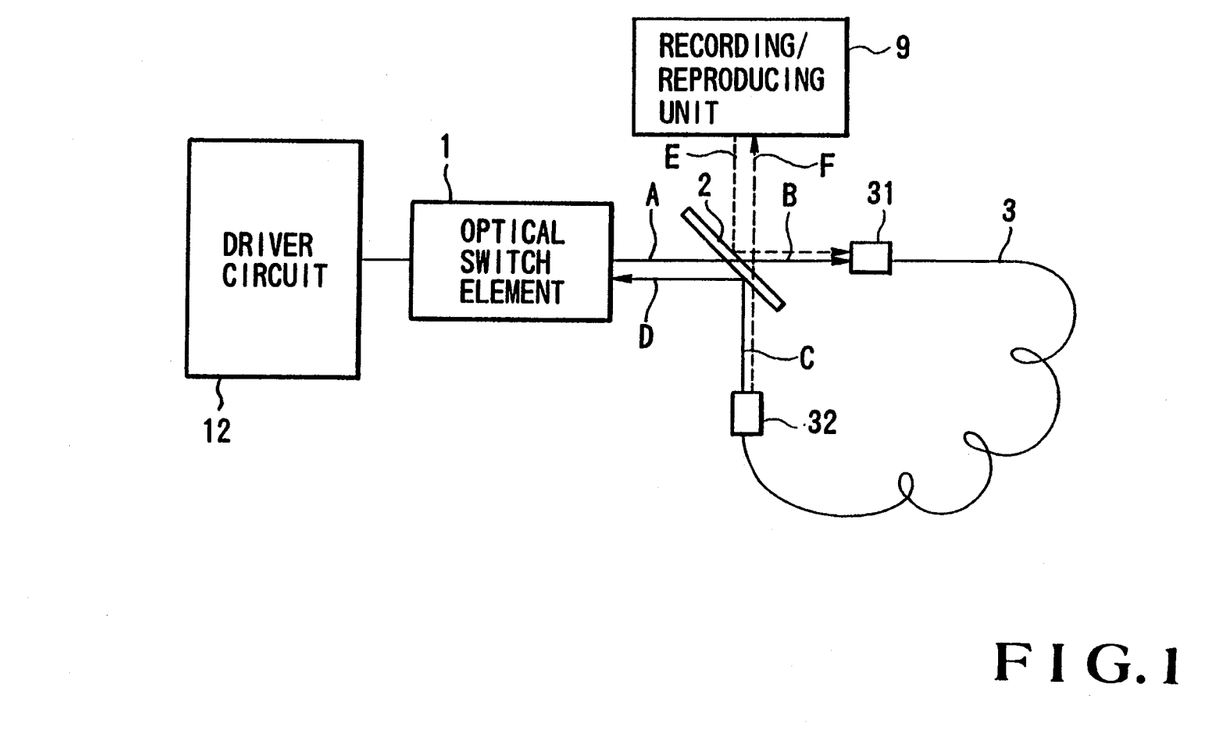
FIG. 1 is a block diagram showing an optical information storage apparatus according to the first embodiment of the present invention.
Figure 2A:
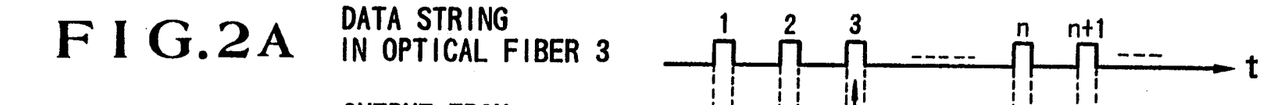
FIGS. 2A to 2C are timing charts of signals at portions of the apparatus, showing an operation of the block diagram in FIG. 1.
Figure 2B:
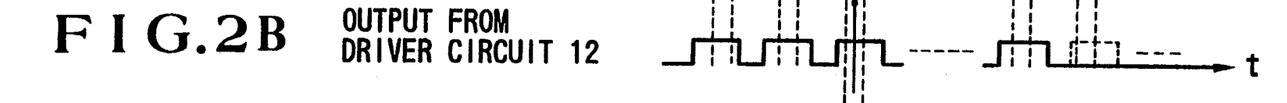
Figure 2C:
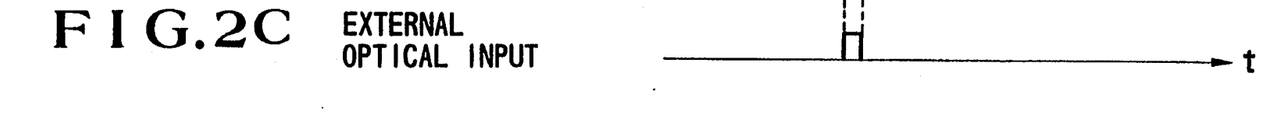

FIG. 1 shows the first embodiment of the present invention. FIGS. 2A to 2C show the waveforms of signals at portions in FIG. 1.

Referring to FIG. 1, a transmitted beam B, of a beam A emitted from an optical switch element 1, which is transmitted through a beam splitter 2 is coupled to one end face 31 of an optical fiber 3. A reflected beam D, of a beam C output from the other end face 32 of the optical fiber 3, which is reflected by the beam splitter 2 is incident on the optical switch element 1. The beam splitter 2 also forms recording and reproducing optical path E, F (indicated by the broken lines) extending to a recording/reproducing unit 9. A driver circuit 12 drives the optical switch element 1 by using a clock having a predetermined frequency. If the optical output and input positions of the optical switch element 1 are the same, a reflected beam (not shown) of the beam A emitted from the optical switch element 1 is coupled to the end face 32 of the optical fiber 3 serving as two-way paths to emerge from the end face 31, and the output beam is multiplexed with the reflected beam D by the beam splitter 2. The resultant beam returns to the optical switch element 1. In this case, in order to separate the recording and reproducing optical path E, F from the recording/reproducing unit 9, the same beam splitter 2 is arranged. In addition, if the beam splitter 2 arranged before the input end face of the optical fiber 3 is constituted by a polarizing beam splitter, and the beam A emitted from the optical switch element 1 is linearly polarized, the output beam A is not reflected by the beam splitter and becomes the transmitted beam B. Therefore, the number of optical transmission directions in the optical fiber 3 can be set to be one.

An operation of the optical information storage apparatus having the above-described arrangement will be described next with reference to FIGS. 2A to 2C. The optical switch element 1 emits an optical output (the output beam A) when an optical input (the reflected beam D) is equal to or greater than a predetermined level. The transmitted beam B incident on the optical fiber 3 and stored as optical information therein becomes the output beam C upon circulating through the loop, and is incident, as the reflected beam D, on the optical switch element 1. If the reflected beam D contains optical information, the optical output is returned to the optical fiber 3 again by the optical switch element 1. With this arrangement, a loss in stored information can be compensated without decreasing the S/N ratio.

In an information recording operation, new information can be added to a data string by supplying an optical input (FIG. 2C) from the recording/reproducing unit 9 to the optical switch element 1 through the optical path E indicated by the broken line in FIG. 1. In an information reproducing operation, an optical output may be detected by the recording/reproducing unit 9 through the reverse path F. Optical information may be recorded by increasing an output voltage from the driver circuit 12 to be equal to or higher than the switching voltage of the optical switch element 1 so as to forcibly set an emission state, instead of using an optical input from the recording/reproducing unit 9. In addition, information may be reproduced by detecting an emission state on the basis of a driving current in the optical switch element 1. Stored data can be erased by stopping the driver circuit 12 from outputting the clock shown in FIG. 2B so as to inhibit light emission of the optical switch element 1, as indicated by an element "n+1" in FIG. 2A.

As described above, in this arrangement, compensation for a loss and recording/reproducing operations can be performed by using one optical switch element, and hence a compact apparatus can be realized.

Figure 3:
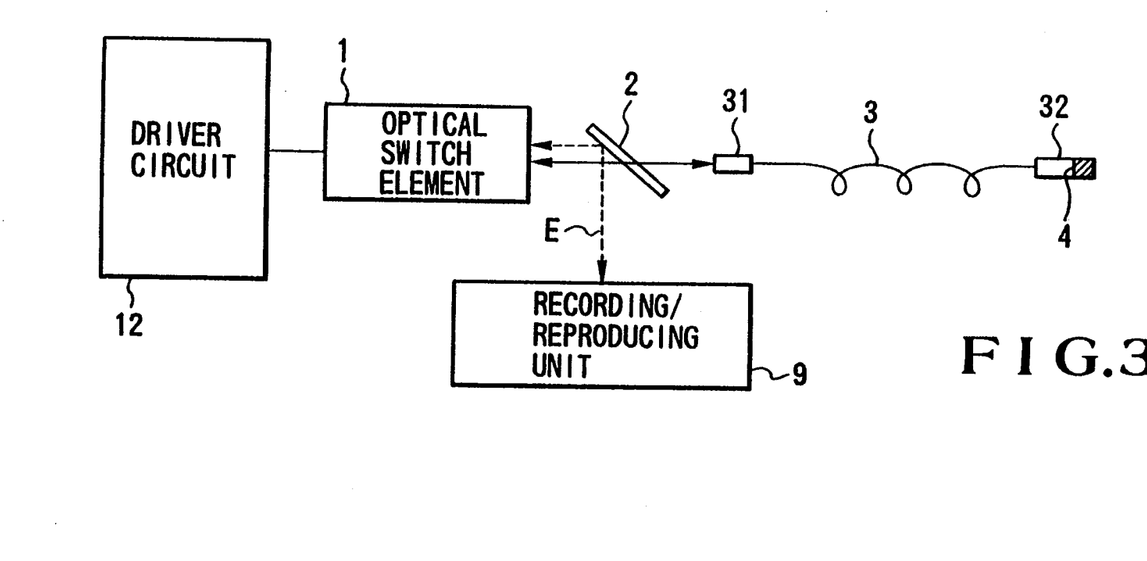
FIG. 3 is a block diagram showing an optical information storage apparatus according to the second embodiment of the present invention.

FIG. 3 shows the second embodiment of the present invention. In this embodiment, the other end face 32 of an optical fiber 3 is designed as a light-reflecting surface.

Referring to FIG. 3, a transmitted beam, of a beam emitted from an optical switch element 1, which is transmitted through a beam splitter 2 is coupled to one end face 31 of the optical fiber 3. Since the other end face 32 of the optical fiber 3 is designed as a light-reflecting surface 4, the guided beam is reflected by the light-reflecting surface 4 to return through the optical fiber 3. The reflected beam is then output from the end face 31 and transmitted through the beam splitter 2 to be incident on the optical switch element 1. A recording-/reproducing beam is coupled to a recording/reproducing unit 9 by the beam splitter 2 through an optical path. A driver circuit 12 drives the optical switch element 1 by using a clock having a predetermined frequency. According to this embodiment, since the optical transmission distance can be doubled, the information storage capacity can be increased.

Figure 4:
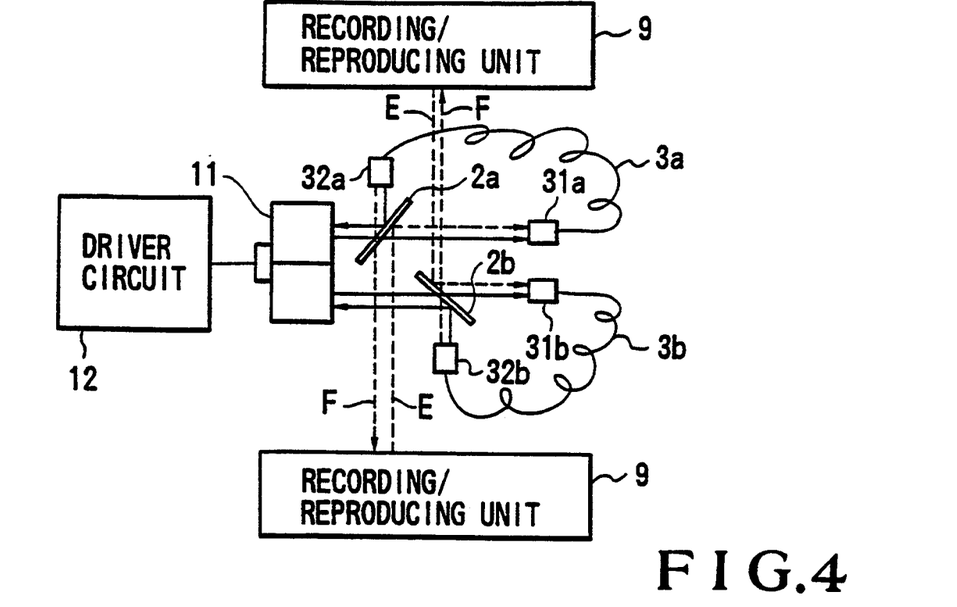
FIG. 4 is a block diagram showing an optical information storage apparatus according to the third embodiment of the present invention.

FIG. 4 shows the third embodiment of the present invention.

In this embodiment, a two-input, two-output differential type optical switch element 11 is used instead of the optical switch element 1. Referring to FIG. 4, transmitted beams, of two beams emitted from the differential type optical switch element 11, which are transmitted through beam splitters 2a and 2b are respectively coupled to end faces 31a and 31b of two optical fibers 3a and 3b on one side. The beams output from end faces 32a and 32b on the other side are respectively reflected by the beam splitters 2a and 2b and are incident on the differential type optical switch element 11. Optical transmission paths E to recording/reproducing units 9 are obtained by the optical paths of beams reflected by the beam splitters 2a and 2b. A driver circuit 12 drives the differential type optical switch element 11 by using a clock having a predetermined frequency. In this arrangement, an optical output is emitted on only a side, of the differential type optical switch element 11, which receives a larger optical input. Therefore, one of the data strings obtained through the two optical fibers 3a, 3b becomes inverted information. The sensitivity of such a differential type element can be improved while the stability is maintained. Therefore, the power consumption required for information storage can be reduced.

Figure 5:
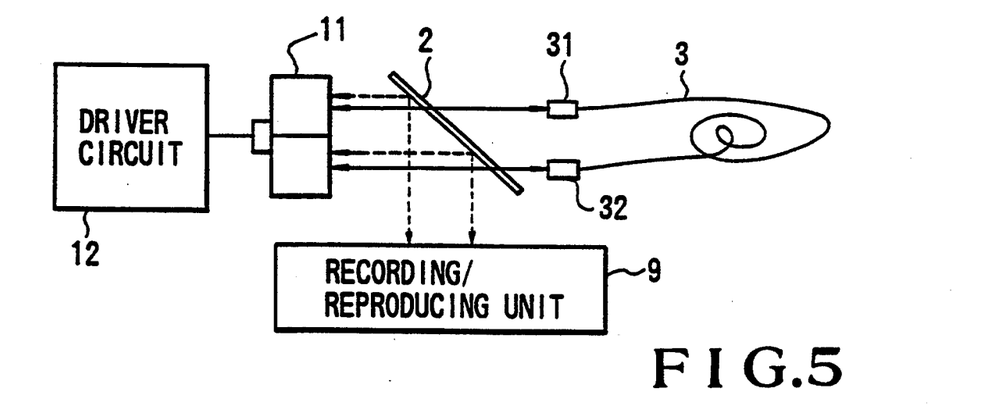
FIG. 5 is a block diagram showing an optical information storage apparatus according to the fourth embodiment of the present invention.

FIG. 5 shows the fourth embodiment of the present invention. In this embodiment, the two inputs and two outputs of a differential type optical switch element 11 are coupled to both end faces 31 and 32 of one optical fiber 3.

Referring to FIG. 5, two beams emitted from the differential type optical switch element 11 are transmitted through a beam splitter 2 and are respectively coupled to the two end faces 31 and 32 of the optical fiber 3 on one side. The two output beams from the end faces 32 and 31 on the other side are transmitted through the beam splitter 2 to be incident on the differential type optical switch element 11. Two optical paths to a recording/reproducing unit 9 are obtained by the optical paths of beams reflected by the beam splitter 2. Optical data strings constituted by two optical outputs propagate in the optical fiber 3 in opposite directions to be incident on the opposite sides of the differential type optical switch element 11. With this arrangement, the number of optical fibers 3 can also be reduced to one. Since an optical output is transmitted, as inverted data, through one way between the input and output end faces, the optical output can be extracted as inverted data of a stored data string during half of the transmission time.

Figure 6:
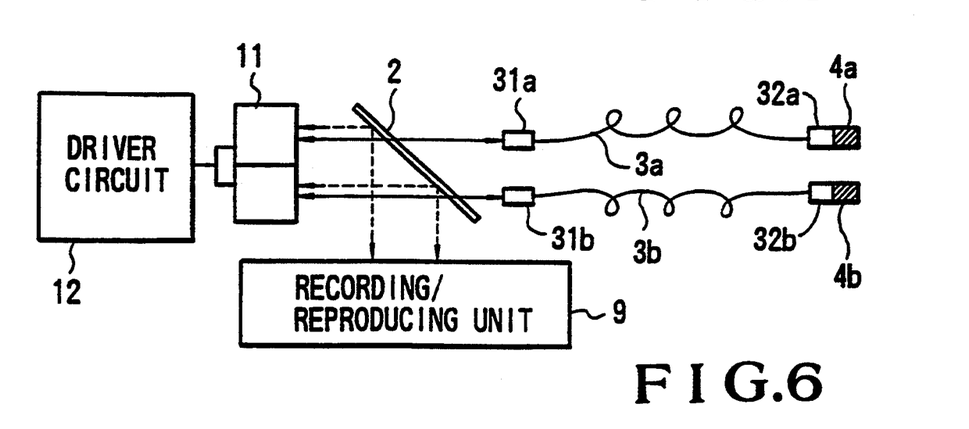
FIG. 6 is a block diagram showing an optical information storage apparatus according to the fifth embodiment of the present invention.

FIG. 6 shows the fifth embodiment of the present invention. This embodiment uses a differential type optical switch element 11 and two reflection type optical fibers 3a and 3b.

Referring to FIG. 6, beams emitted from the differential type optical switch element 11 are transmitted through a beam splitter 2 and are respectively coupled to end faces 31a and 31b of the two optical fibers 3a and 3b on one side. Since end faces 32a and 32b on the other side are constituted by light-reflecting surfaces 4a and 4b, the guided beams are reflected to return through the optical fibers 3a and 3b so as to be incident on the differential type optical switch element 11.

Figure 7:
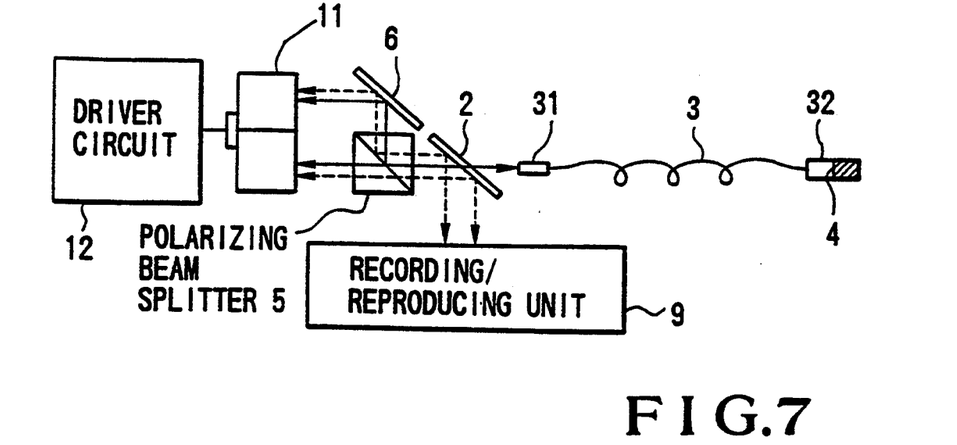
FIG. 7 is a block diagram showing an optical information storage apparatus according to the sixth embodiment of the present invention.

FIG. 7 shows the sixth embodiment of the present invention. In this embodiment, two optical outputs from a differential type optical switch element 11 are linearly polarized beams which are orthogonal to each other.

Referring to FIG. 7, two orthogonal, linearly polarized beams emitted from the differential type optical switch element 11 are multiplexed by a mirror 6 and a polarizing beam splitter 5. The resultant beam is transmitted through a beam splitter 2 and is coupled to one end face 31 of an optical fiber 3. Since the other end face 32 of the optical fiber 3 is constituted by a light-reflecting surface 4, the guided beam is reflected to return through the optical fiber 3 so as to be split into two polarized light components by the polarizing beam splitter 5 and the mirror 6. The two polarized light components are incident on the differential type optical switch element 11. According to this embodiment, one polarized beam is transmitted through the polarizing beam splitter 5, while the other polarized beam is reflected by the polarizing beam splitter 5, thus multiplexing two input/output beams and demultiplexing the multiplexed beam. With this arrangement, the number of optical fibers 3 can be reduced to one.

Figure 8:
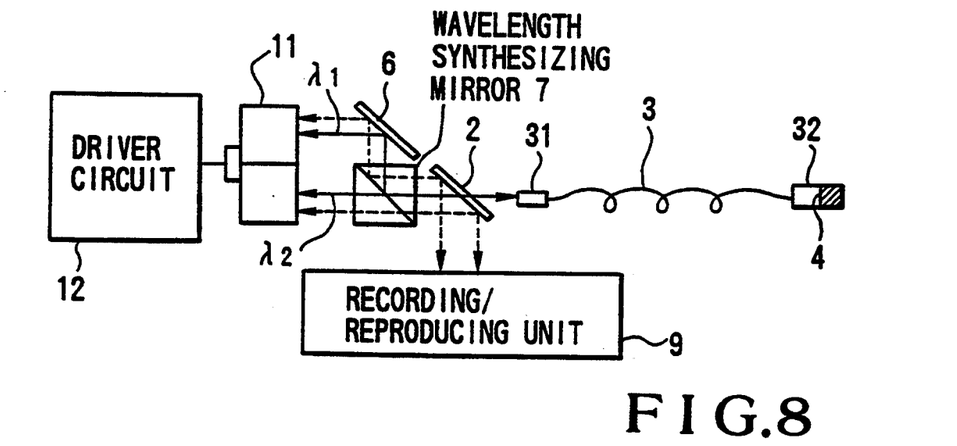
FIG. 8 is a block diagram showing an optical information storage apparatus according to the seventh embodiment of the present invention.

FIG. 8 shows the seventh embodiment of the present invention. In this embodiment, two outputs from a differential type optical switch element 11 are beams having different wavelengths λ1 and λ2.

Referring to FIG. 8, beams having two wavelengths λ1 and λ2, emitted from the differential type optical switch element 11, are multiplexed by a mirror 6 and a wavelength multiplexing mirror 7. The resultant beam is transmitted through a beam splitter 2 and is coupled to one end face 31 of an optical fiber 3. Since the other end face 32 of the optical fiber 3 is constituted by a light-reflecting surface 4, the guided beam is reflected to return through the optical fiber 3 so as to be split into two beams having different wavelengths by the wavelength multiplexing mirror 7 and the mirror 6. The two beams are then incident on the differential type optical switch element 11. According to this embodiment, since two input/output beams are multiplexed or the multiplexed beam is demultiplexed by the wavelength multiplexing mirror 7, the number of optical fibers 3 can also be reduced to one. In addition, even fluctuations in polarized beams in the optical fiber have no influence on the operation of the apparatus.

Figure 9:
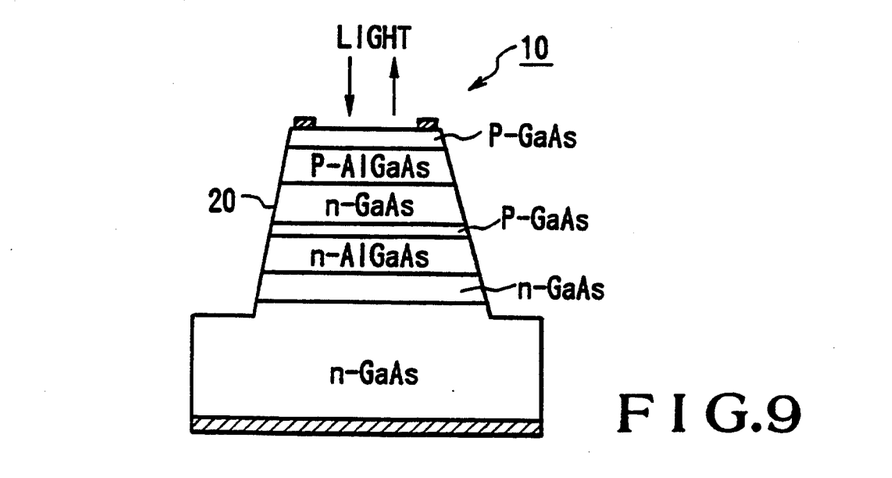
FIG. 9 is a sectional view showing the arrangement of an optical switch element used in the present invention.
Figure 10:
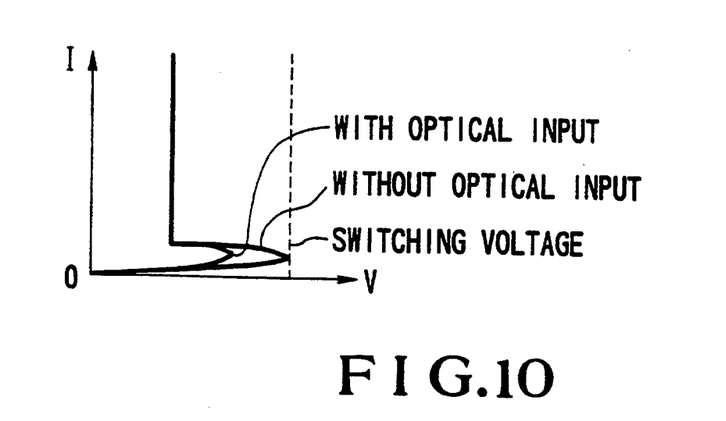
FIG. 10 is a graph showing the characteristics of the optical switch element in FIG. 9.
Figure 11:
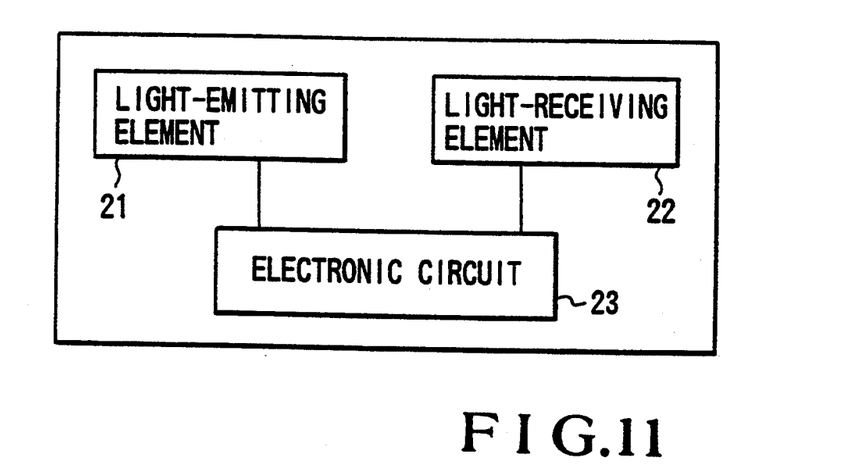
FIG. 11 is a block diagram showing the arrangement of another optical switch element.
Figure 12:
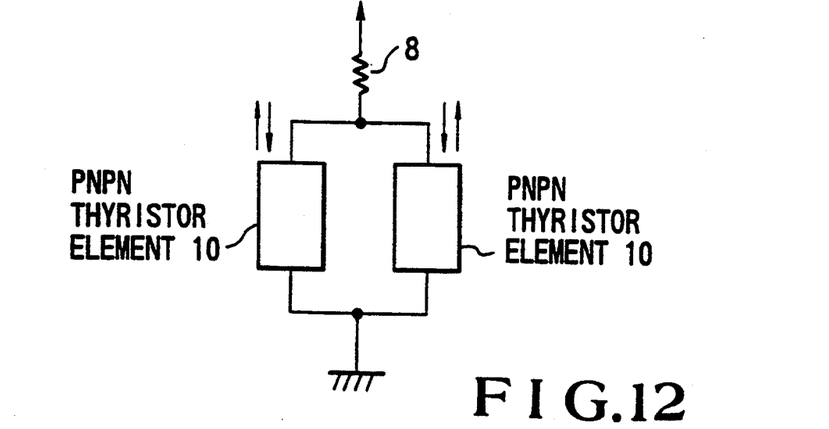
FIG. 12 is a block diagram showing an arrangement of a differential type optical switch element in the present invention.

FIG. 9 shows an optical switch element used in the present invention. FIG. 10 shows the characteristics of the optical switch element in FIG. 9. FIG. 11 shows another optical switch element. FIG. 12 shows an arrangement of the differential type optical switch element in the present invention.

As the optical switch element 1 used in the embodiments described above, an optical thyristor element 10 can be used, which is formed by combining an optical active layer 20 with a pnpn thyristor structure through a heterojunction. The optical thyristor element 10 has I-V characteristics such as those shown in FIG. 10, and can switch between an emission state and a non-emission state in accordance with a switching voltage. The presence of an optical input decreases the switching voltage. For this reason, if the voltage applied to the element is set to be slightly lower than the switching voltage, the element can be switched to an emission state by an optical input.

An optical switch element having the above-described function can also be constituted by a hybrid element formed by coupling a light-emitting element 21 and a light-receiving element 22 to each other through an electronic circuit 23, as shown in FIG. 11.

The differential type optical switch element 11 can be formed by connecting pnpn thyristor elements 10 (shown in FIG. 9) to a common load resistor 8 in parallel, as shown in FIG. 12. As the applied voltage increases, one of the elements 10 which receives a larger optical input is set in an emission state, and a current flows in this element. At this time, since a voltage drop is caused by the common load resistor 8, the other element 10 cannot perform light emission. With this effect, a differential element structure can be realized.

In each embodiment described above, only an optical fiber loop is used. However, a plurality of loops may be constituted by an array of optical switches and ribbon fibers.

As has been described above, the present invention includes an optical switch element and an optical fiber. The optical switch element emits an optical output upon reception of an optical input having a predetermined level or more. The present invention also includes an optical path through which optical information stored in the optical fiber is incident on the optical switch element upon circulating through the optical loop or by reflection. With this arrangement, a loss in stored optical information is compensated without decreasing the S/N ratio of the optical information, thereby providing an optical information storage apparatus, which is smaller in size than a conventional apparatus, without requiring any optical amplifier.

What is claimed is:

1. An optical information storage apparatus comprising:
   an optical switch element for receiving an optical input and emitting an optical output only when the optical input is equal to or greater than a predetermined level; and
   an optical fiber having a first end face and a second end face, the optical fiber constituting a first optical path for receiving the optical output emitted from said optical switch element through at least one of said first and second end faces, guiding the optical output, and emitting an output beam, constituting the optical input, onto said optical switch element.

2. An apparatus according to claim 1, further comprising a second optical path and a recording and reproducing device for supplying the optical input to one of said optical switch element and said optical fiber through the second optical path, and detecting the optical output emitted from the other of said optical switch element and said optical fiber.

3. An apparatus according to claim 1, wherein said optical fiber outputs the optical output emitted from said optical switch element and received through said first end face, to said optical switch element through said second end face.

4. An apparatus according to claim 2, further comprising a beam splitter for transmitting and reflecting the optical output in order to form the second optical path between said recording and reproducing device and one of said optical switch element and said optical fiber.

5. An apparatus according to claim 3, further comprising a beam splitter for transmitting the optical output from said optical switch element to said first end face of the optical fiber and reflecting the optical output from said second end face of said optical fiber to said optical switch element.

6. An optical information storage apparatus comprising:
   an optical switch element for receiving an optical input and emitting an optical output only when the optical input is equal to or greater than a predetermined level; and
   an optical fiber having a first end face and a second end face, the optical fiber constituting a first optical path for receiving the optical output emitted from said optical switch element through at least one of said first and second end faces, guiding the optical output, and emitting an output beam, constituting the optical input, onto said optical switch element; wherein
   said optical fiber includes a light-reflecting surface for reflecting a guided beam to said second end face, and causes the optical output, emitted from said optical switch element and incident through said first end face, to be reflected by said second end face, thereby outputting the optical output to said optical switch element through said first end face.

7. An optical information storage apparatus comprising:
   a differential type optical switch element having first and second sides for receiving first and second optical inputs and emitting first and second optical outputs therefrom, one of the first and second sides emitting one of the first and second optical outputs only when a difference between said first and second optical inputs is equal to or greater than a predetermined value;
   a first optical fiber having first and second end faces, the first optical fiber constituting a first optical path for receiving the first optical output emitted from said differential type optical switch element through at least one of said first and second end faces of said first optical fiber, guiding the first optical output, and emitting an output beam, constituting the first optical input, onto said optical switch element; and
   a second optical fiber having first and second end faces, the second optical fiber constituting a second optical path for receiving the second optical output emitted from said differential type optical switch element through at least one of said first and second end faces of said second optical fiber, guiding the second optical output, and emitting an output beam, constituting the second optical input, onto said optical switch element.

8. An apparatus according to claim 7, further comprising third and fourth optical paths and a recording and reproducing device for supplying the first and second optical inputs to said differential type optical switch element through said third and fourth optical paths, and detecting the first and second optical outputs emitted from said optical switch element.

9. An apparatus according to claim 7, wherein each of said first and second optical fibers outputs a corresponding one of the first and second optical outputs, emitted from said differential type optical switch element and received through a corresponding one of said first end faces, to said differential type optical switch element through a corresponding one of said second end faces.

10. An apparatus according to claim 7, wherein each of said first and second optical fibers includes a light-reflecting surface for reflecting a guided beam to a corresponding one of said second end faces, and causes a corresponding one of the first and second optical outputs, emitted from said differential type optical switch element and incident through a corresponding one of said first end faces, to be reflected by the corresponding one of said second end faces, thereby outputting a corresponding optical output to said differential type optical switch element through the corresponding one of said first end faces.

11. An optical information storage apparatus comprising:
   a differential type optical switch element having first and second sides for receiving first and second optical inputs and emitting first and second optical outputs therefrom, one of the first and second sides emitting one of the first and second outputs only when a difference between said first and second optical inputs is equal to or greater than a predetermined value; and
   an optical fiber having first and second end faces, the optical fiber constituting a first optical path for receiving the first and second optical outputs emitted from said differential type optical switch element through both of said first and second end faces, guiding the optical outputs, and emitting output beams, constituting the first and second optical inputs, from said first and second end faces onto said differential type optical switch element.

12. An apparatus according to claim 11, further comprising second and third optical paths and a recording and reproducing device for supplying the first and second optical inputs to said differential type optical switch element through said second and third optical paths, and detecting the first and second optical outputs emitted from said optical switch element.

* * * * *